(12) United States Patent
Rau et al.

(10) Patent No.: US 11,784,631 B2
(45) Date of Patent: Oct. 10, 2023

(54) CRYSTAL DEVICE AND RESONANCE ELEMENT

(71) Applicant: TAI-SAW Technology Co., Ltd., Taoyuan (TW)

(72) Inventors: Chia-Haur Rau, Taoyuan (TW); Kun-Yu Huang, Taoyuan (TW); Chi-Yun Chen, Taoyuan (TW)

(73) Assignee: TAI-SAW TECHNOLOGY CO., LTD., Taoyuan (TW)

( * ) Notice: Subject to any disclaimer, the term of this patent is extended or adjusted under 35 U.S.C. 154(b) by 0 days.

(21) Appl. No.: 17/691,674

(22) Filed: Mar. 10, 2022

(65) Prior Publication Data

US 2022/0294419 A1 Sep. 15, 2022

(30) Foreign Application Priority Data

Mar. 15, 2021 (TW) .................................. 110109204

(51) Int. Cl.
*H03H 9/19* (2006.01)
*H03B 5/32* (2006.01)
*H10N 30/87* (2023.01)

(52) U.S. Cl.
CPC ................. *H03H 9/19* (2013.01); *H03B 5/32* (2013.01); *H10N 30/872* (2023.02)

(58) Field of Classification Search
CPC .. H03H 9/19; H03H 9/02023; H03H 9/02157; H03H 9/0509; H03H 9/1021; H03B 5/32; H10N 30/872
See application file for complete search history.

(56) References Cited

U.S. PATENT DOCUMENTS

| 7,915,791 B2 * | 3/2011 | Akane .................. H03H 9/1021 310/365 |
| 2009/0085428 A1 | 4/2009 | Maeda |
| 2015/0108875 A1 * | 4/2015 | Yang .................... H03H 9/0509 310/348 |

* cited by examiner

*Primary Examiner* — Jeffrey M Shin
(74) *Attorney, Agent, or Firm* — Volpe Koenig

(57) ABSTRACT

A resonance element supported by a bearing structure includes a crystal chip and an excitation electrode. The crystal chip includes a main surface having a support surface portion being in contact with the bearing structure. The excitation electrode is disposed on the main surface, has an electrode area, and includes an electrode indentation boundary partly encompassing the support surface portion. The electrode indentation boundary has a first boundary end and a second boundary end being opposite to the first boundary end. The electrode indentation boundary and a reference line segment defined by the first and the second boundary ends form an electrode indentation region having an indentation area. A ratio of the indentation area to the electrode area ranges from 0.05 to 0.2.

19 Claims, 22 Drawing Sheets

CRYSTAL DEVICE AND RESONANCE ELEMENT

CROSS-REFERENCE TO RELATED APPLICATION AND CLAIM OF PRIORITY

This application claims the benefit of Taiwan Patent Application No. 110109204, filed on Mar. 15, 2021, at the Taiwan Intellectual Property Office, the disclosures of which are incorporated herein in their entirety by reference.

TECHNICAL FIELD

The present disclosure is related to a crystal device and, more particularly, is related to a crystal device having an excitation electrode and a resonance element.

BACKGROUND

A quartz crystal device can be used to generate a reference signal, and includes a ceramic seat body, a quartz chip, two metal electrodes and a plurality of conductive adhesives. The quartz chip has a relatively short edge, four corner regions, a first surface, and a second surface being opposite to the first surface. The two metal electrodes are respectively disposed on the first and the second surfaces, and are extended to the relatively short edge. The plurality of conductive adhesives respectively located in the four corner regions are used to bond the quartz chip with the ceramic seat body to form a stable structure.

There is an application demand to cause the quartz crystal device to be applied in a vibration environment. Therefore, there is an application demand to improve the structure of the quartz crystal device to reliably operate the improved quartz crystal device in the vibration environment.

SUMMARY OF EXEMPLARY EMBODIMENTS

It is one aspect of the present disclosure to provide a crystal device, which includes a crystal chip and an excitation electrode disposed on the crystal chip. The excitation electrode has a first specific geometrical shape according to a second specific geometrical shape of the crystal chip to avoid influencing the best excitation mode of the crystal device.

It is therefore one embodiment of the present disclosure to provide a crystal device. The crystal device includes a bearing structure and an integrated chip supported by the bearing structure, wherein the integrated chip includes a crystal chip and a first excitation electrode. The crystal chip includes a first main surface having a first support surface portion being in contact with the bearing structure. The first excitation electrode is disposed on the first main surface, has an electrode area, and includes a first electrode indentation boundary partly encompassing the first support surface portion. The first electrode indentation boundary has a first boundary end and a second boundary end being opposite to the first boundary end. The first electrode indentation boundary and a first reference line segment defined by the first and the second boundary ends form a first electrode indentation region having an indentation area. A ratio of the indentation area to the electrode area ranges from 0.05 to 0.2.

It is therefore another embodiment of the present disclosure to provide a resonance element supported by a bearing structure. The resonance element includes a crystal chip and a first excitation electrode. The crystal chip includes a first main surface having a first support surface portion being in contact with the bearing structure. The first excitation electrode is disposed on the first main surface, has an electrode area, and includes a first electrode indentation boundary partly encompassing the first support surface portion. The first electrode indentation boundary has a first boundary end and a second boundary end being opposite to the first boundary end. The first electrode indentation boundary and a first reference line segment defined by the first and the second boundary ends form a first electrode indentation region having an indentation area. A ratio of the indentation area to the electrode area ranges from 0.05 to 0.2.

It is therefore another embodiment of the present disclosure to provide an element supported by a bearing structure. The element includes a crystal chip and an electrode structure. The crystal chip has a surface structure. The electrode structure is disposed on the surface structure, and includes an excitation electrode, an extension electrode having a first signal transmission terminal, and a second signal transmission terminal matching the first signal transmission terminal. The first and the second signal transmission terminals are disposed on one side of the crystal chip. The extension electrode extends from the excitation electrode. The bearing structure supports the crystal chip through the first and the second signal transmission terminals. The excitation electrode has a closed boundary. The closed boundary includes a concave boundary segment.

BRIEF DESCRIPTION OF THE DRAWINGS

The foregoing and other features and advantages of the present disclosure will be more clearly understood through the following descriptions with reference to the drawings, wherein.

DETAILED DESCRIPTION OF THE PREFERRED EMBODIMENTS

The present disclosure will now be described more specifically with reference to the following embodiments. It is to be noted that the following descriptions of preferred embodiments of this disclosure are presented herein for the purposes of illustration and description only; they are not intended to be exhaustive or to be limited to the precise form disclosed.

Figure 1A:
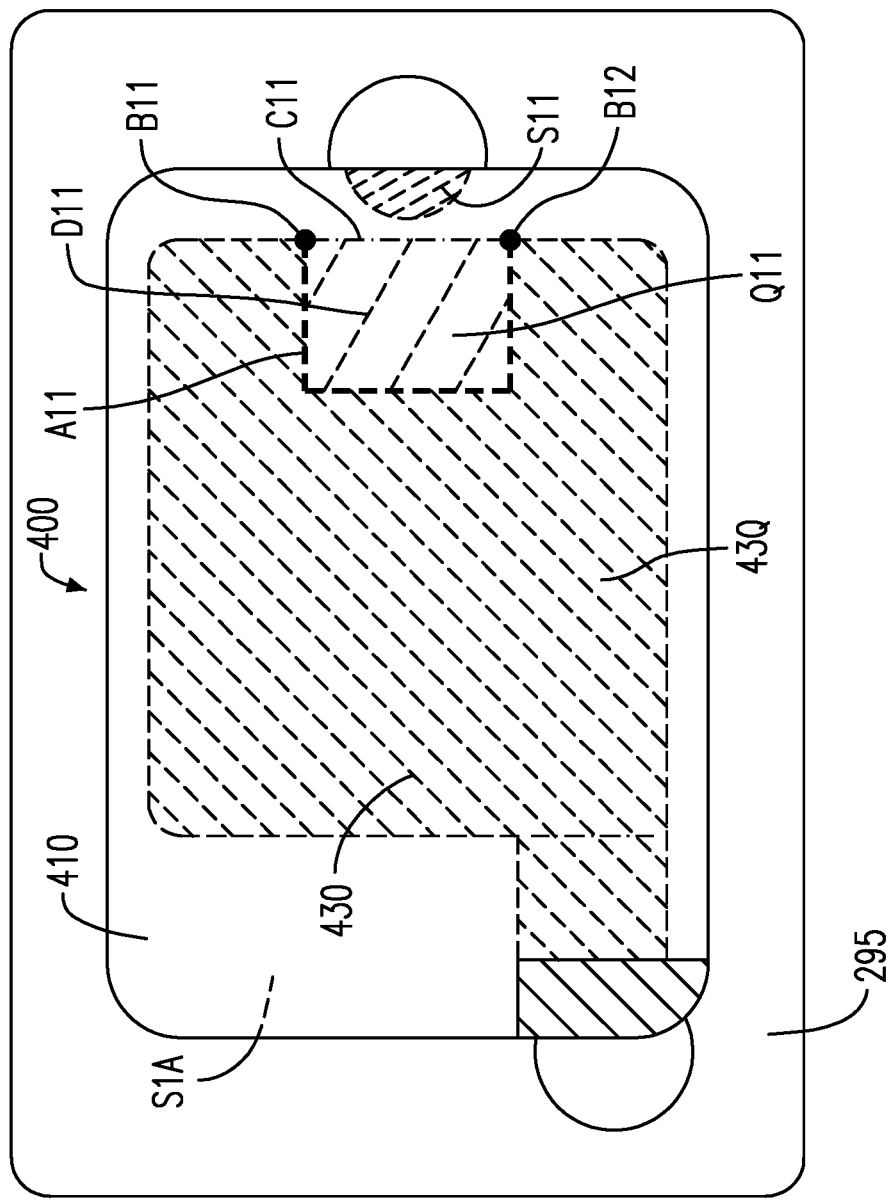
FIG. 1A is a schematic diagram showing a top view of a crystal device according to various embodiments of the present disclosure.
Figure 1B:
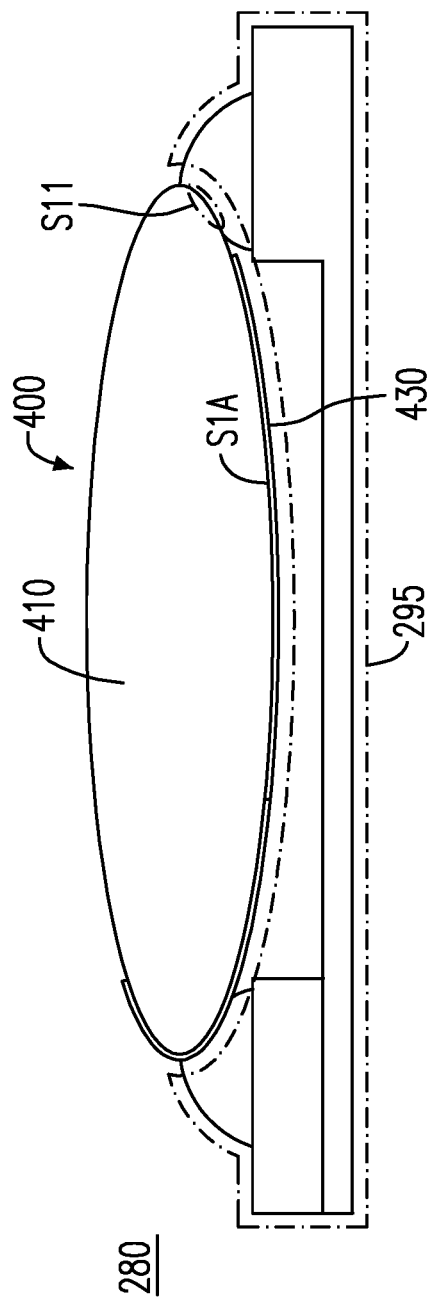
FIG. 1B is a schematic diagram showing a front view of the crystal device shown in FIG. 1A.
Figure 1C:
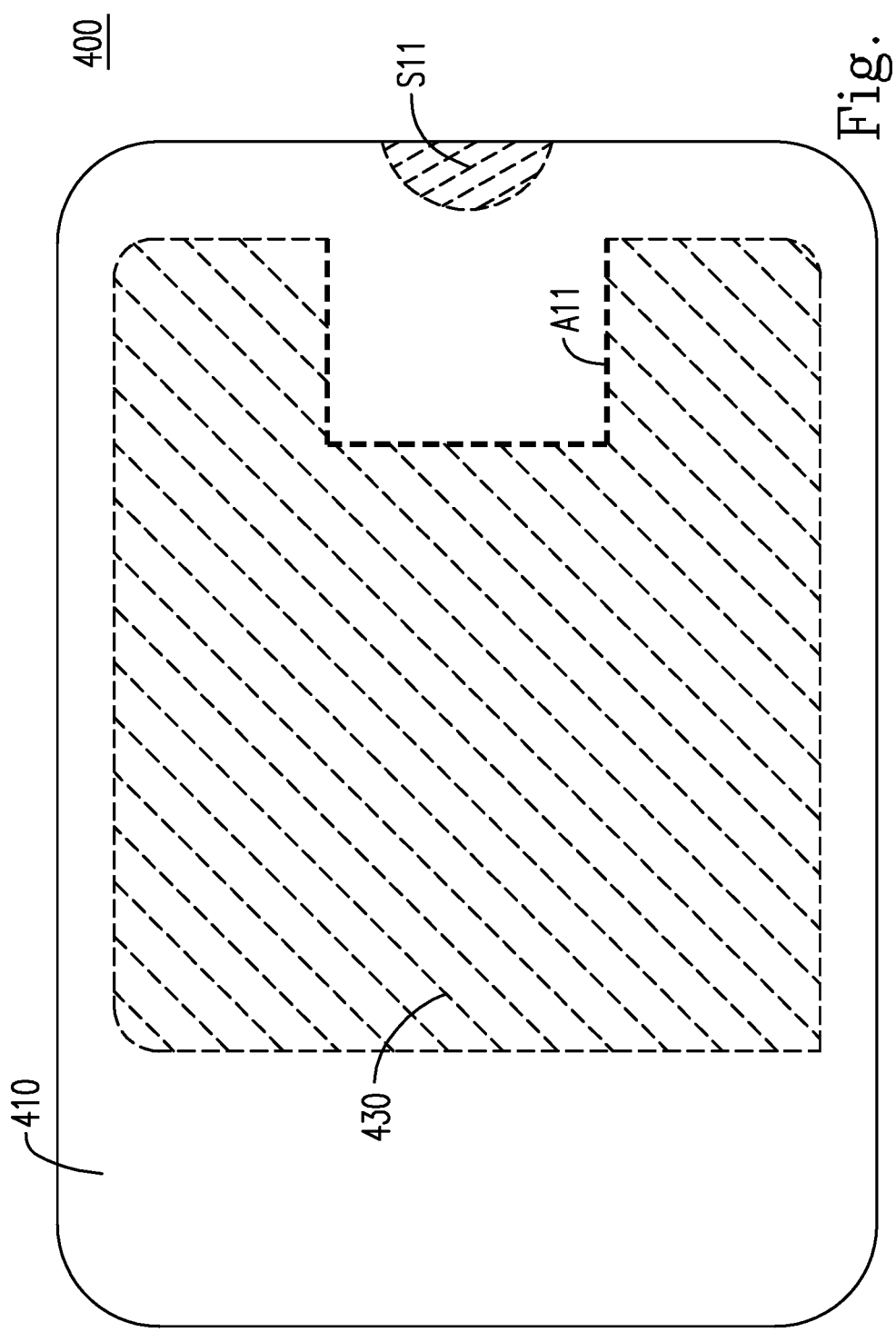
FIG. 1C is a schematic diagram showing a top view of an integrated chip included in the crystal device shown in FIG. 1A.

Please refer to FIG. 1A, FIG. 1B and FIG. 1C. FIG. 1A is a schematic diagram showing a top view of a crystal device 280 according to various embodiments of the present disclosure. FIG. 1B is a schematic diagram showing a front view of the crystal device 280 shown in FIG. 1A. FIG. 1C is a schematic diagram showing a top view of an integrated chip 400 included in the crystal device 280 shown in FIG. 1A. As shown in FIGS. 1A, 1B and 1C, the crystal device 280 includes a bearing structure 295 and the integrated chip 400 supported by the bearing structure 295. The integrated chip 400 includes a crystal chip 410 and a first excitation electrode 430. The crystal chip 410 includes a first main surface S1A having a first support surface portion S11. For example, the first support surface portion S11 is in contact with the bearing structure 295.

The first excitation electrode 430 is disposed on the first main surface S1A, has an electrode area 43Q, and includes a first electrode indentation boundary A11, wherein the first support surface portion S11 is partly encompassed by the first electrode indentation boundary A11. For example, the first electrode indentation boundary A11 has a first boundary end B11 and a second boundary end B12 being opposite to the first boundary end B11. The first electrode indentation boundary A11 and a first reference line segment C11 defined by the first and the second boundary ends B11 and B12 form a first electrode indentation region D11 having an indentation area Q11. A ratio of the indentation area Q11 to the electrode area 43Q ranges from 0.05 to 0.2.

Figure 2A:
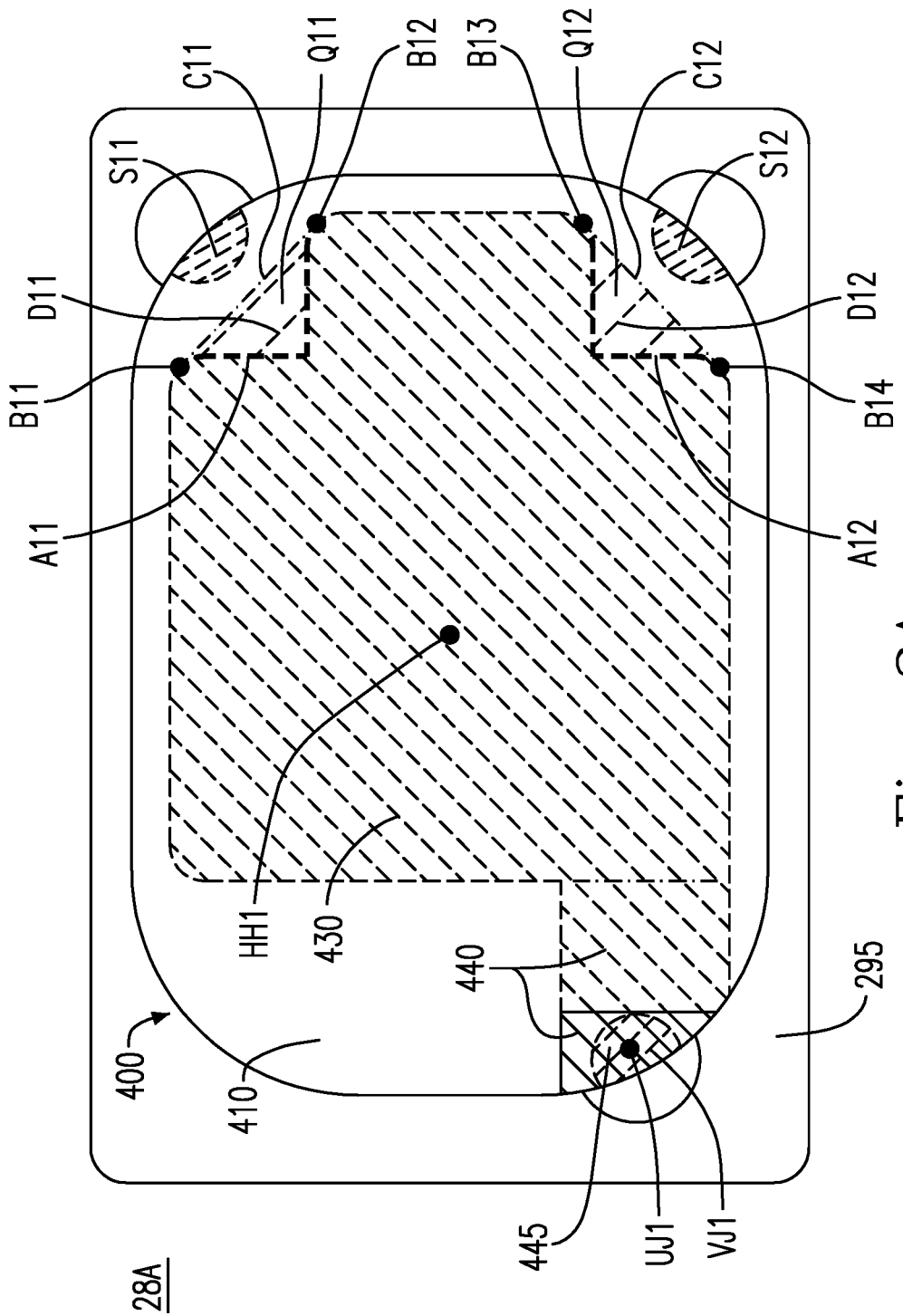
FIG. 2A is a schematic diagram showing a top view of an implementation structure of the crystal device shown in FIG. 1A.
Figure 2B:
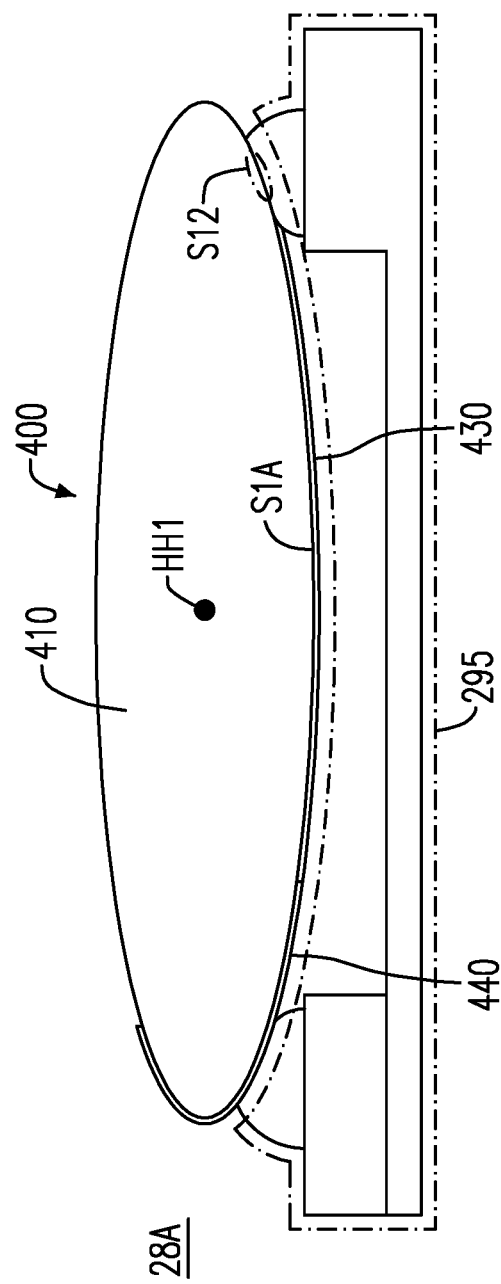
FIG. 2B is a schematic diagram showing a front view of the implementation structure shown in FIG. 2A.
Figure 2C:
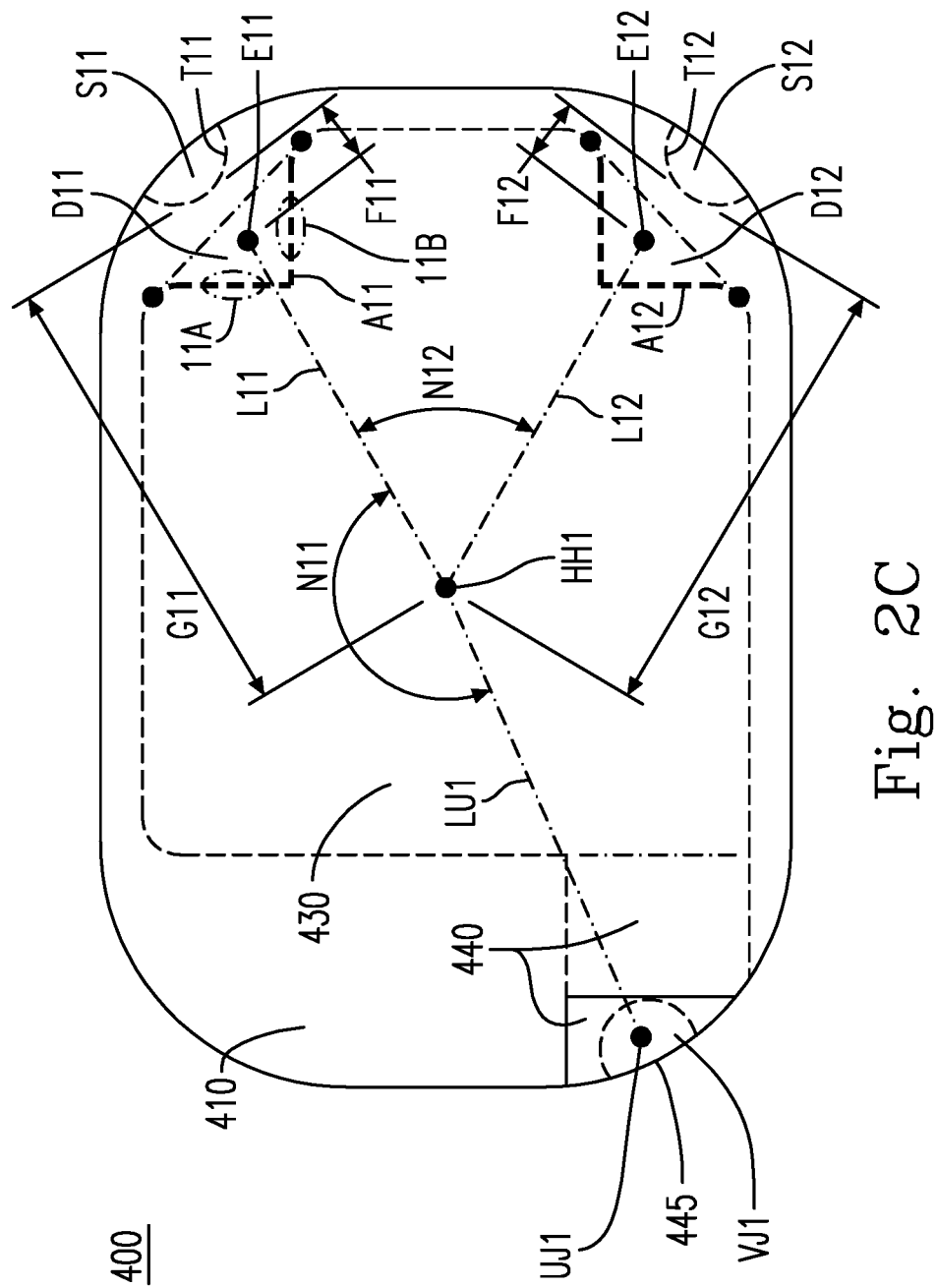
FIG. 2C is a schematic diagram showing a top view of an integrated chip included in the implementation structure shown in FIG. 2A.

Please refer to FIG. 2A, FIG. 2B and FIG. 2C. FIG. 2A is a schematic diagram showing a top view of an implementation structure 28A of the crystal device 280 shown in FIG. 1A. FIG. 2B is a schematic diagram showing a front view of the implementation structure 28A shown in FIG. 2A. FIG. 2C is a schematic diagram showing a top view of an integrated chip 400 included in the implementation structure 28A shown in FIG. 2A. Please additionally refer to FIGS. 1A, 1B and 1C. As shown in FIGS. 2A, 2B and 2C, the crystal device 280 includes the bearing structure 295 and the integrated chip 400.

In some embodiments, the first electrode indentation region D11 is adjacent to the first support surface portion S11, and further has a first indentation regional center E11. The first main surface S1A further has a second support surface portion S12 being separate from the first support surface portion S11. For example, the second support surface portion S12 is in contact with the bearing structure 295. The first excitation electrode 430 further includes a second electrode indentation boundary A12, wherein the second support surface portion S12 is partly encompassed by the second electrode indentation boundary A12. For example, the first support surface portion S11 is partly encompassed by the first electrode indentation boundary A11. The second support surface portion S12 is locally encompassed by the second electrode indentation boundary A12.

For example, the second electrode indentation boundary A12 has a third boundary end B13 and a fourth boundary end B14 being opposite to the third boundary end B13. The second electrode indentation boundary A12 and a second reference line segment C12 defined by the third and the fourth boundary ends B1 and B14 form a second electrode indentation region D12 having a second indentation regional center E12. The second electrode indentation region D12 further has an indentation area Q12. A ratio of the indentation area Q12 to the electrode area 43Q ranges between 0.05 and 0.2. For example, the indentation area Q12 is substantially equal to the indentation area Q11.

The crystal chip 410 has a centroid HH1. The centroid HH1 and the first indentation regional center E11 define a third reference line segment L11 therebetween. The centroid HH1 and the second indentation regional center E12 define a fourth reference line segment L12 therebetween. An included angle N12 formed between the third and the fourth reference line segments L11 and L12 ranges from 30 degrees to 90 degrees. For example, the first and the second reference line segments C11 and C12 are respectively two reference straight line segments. Preferably, the included angle N12 ranges from 50 degrees to 70 degrees.

In some embodiments, the crystal chip 410 has a centroid HH1. The first electrode indentation region D11 has a first indentation regional center E11. The integrated chip 400 further includes a first extension electrode 440. The first extension electrode 440 extends from the first excitation electrode 430, and includes a first signal transmission terminal 445 being in contact with the bearing structure 295. The first signal transmission terminal 445 has a first support regional center UJ1. The centroid HH1 and the first support regional center UJ1 define a second reference line segment LU1 therebetween. The centroid HH1 and the first indentation regional center E11 define a third reference line segment L11 therebetween. A first included angle N11 formed between the second and the third reference line segments LU1 and L11 ranges from 100 degrees to 220 degrees. For example, the first signal transmission terminal 445 includes a support region VJ1. The support region VJ1 has the first support regional center UJ1. Preferably, the first included angle N11 ranges from 140 degrees to 180 degrees.

The first support surface portion S11 has an edge T11 being opposite to the first electrode indentation boundary A11. The first indentation regional center E11 and the edge T11 define a shortest distance F11 therebetween. The centroid HH1 and the edge T11 define a shortest distance G11 therebetween. A ratio of the shortest distance F11 to the shortest distance G11 ranges from 0.03 to 0.2. The second support surface portion S12 has an edge T12 being opposite to the second electrode indentation boundary A12. The second indentation regional center E12 and the edge T12 define a shortest distance F12 therebetween. The centroid HH1 and the edge T12 define a shortest distance G12 therebetween. A ratio of the shortest distance F12 to the shortest distance G12 ranges from 0.03 to 0.2. For example, the first electrode indentation boundary A11 includes a first straight line segment 11A and a second straight line segment 11B being adjacent to the first straight line segment 11A.

Figure 3A:
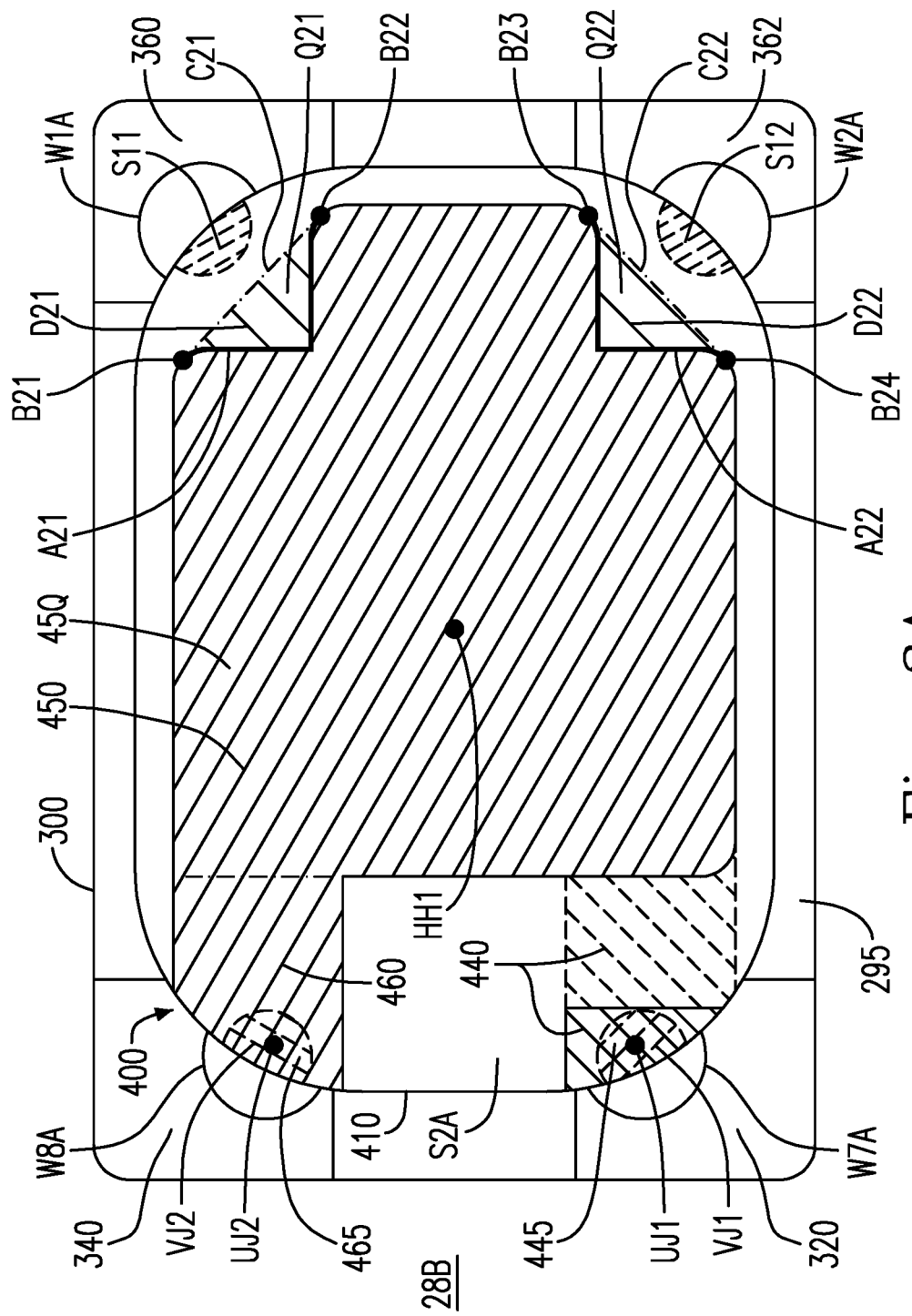
FIG. 3A is a schematic diagram showing a top view of an implementation structure of the crystal device shown in FIG. 1A.
Figure 3B:
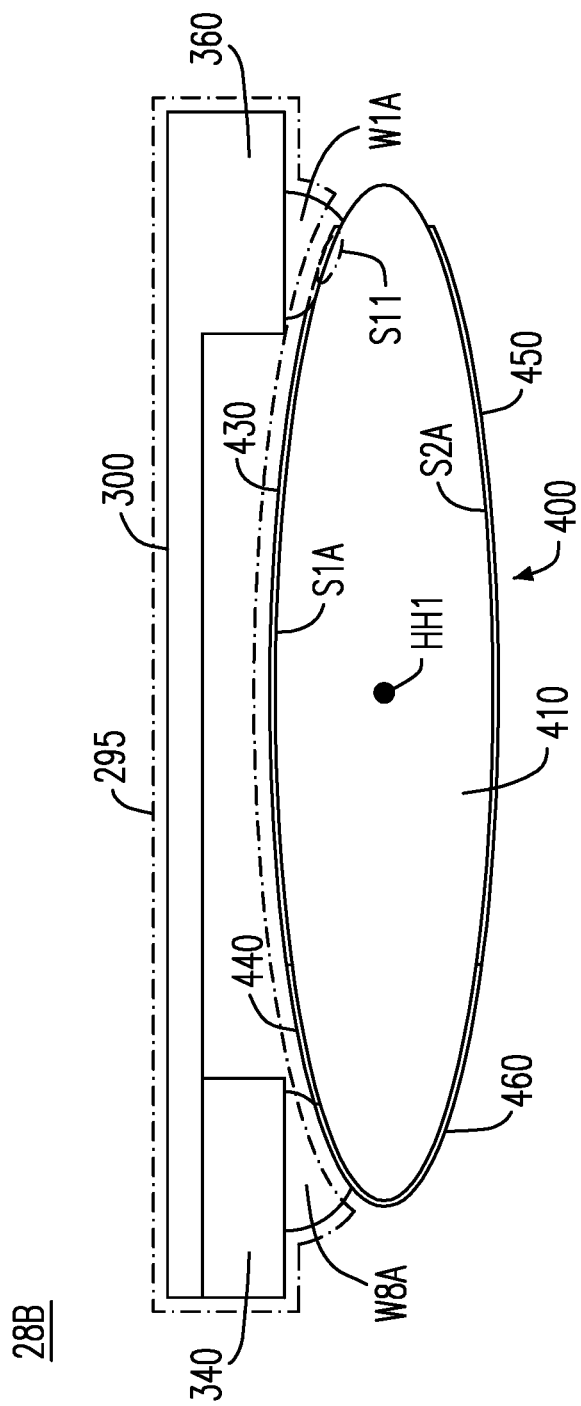
FIG. 3B is a schematic diagram showing a rear view of the implementation structure shown in FIG. 3A.
Figure 3C:
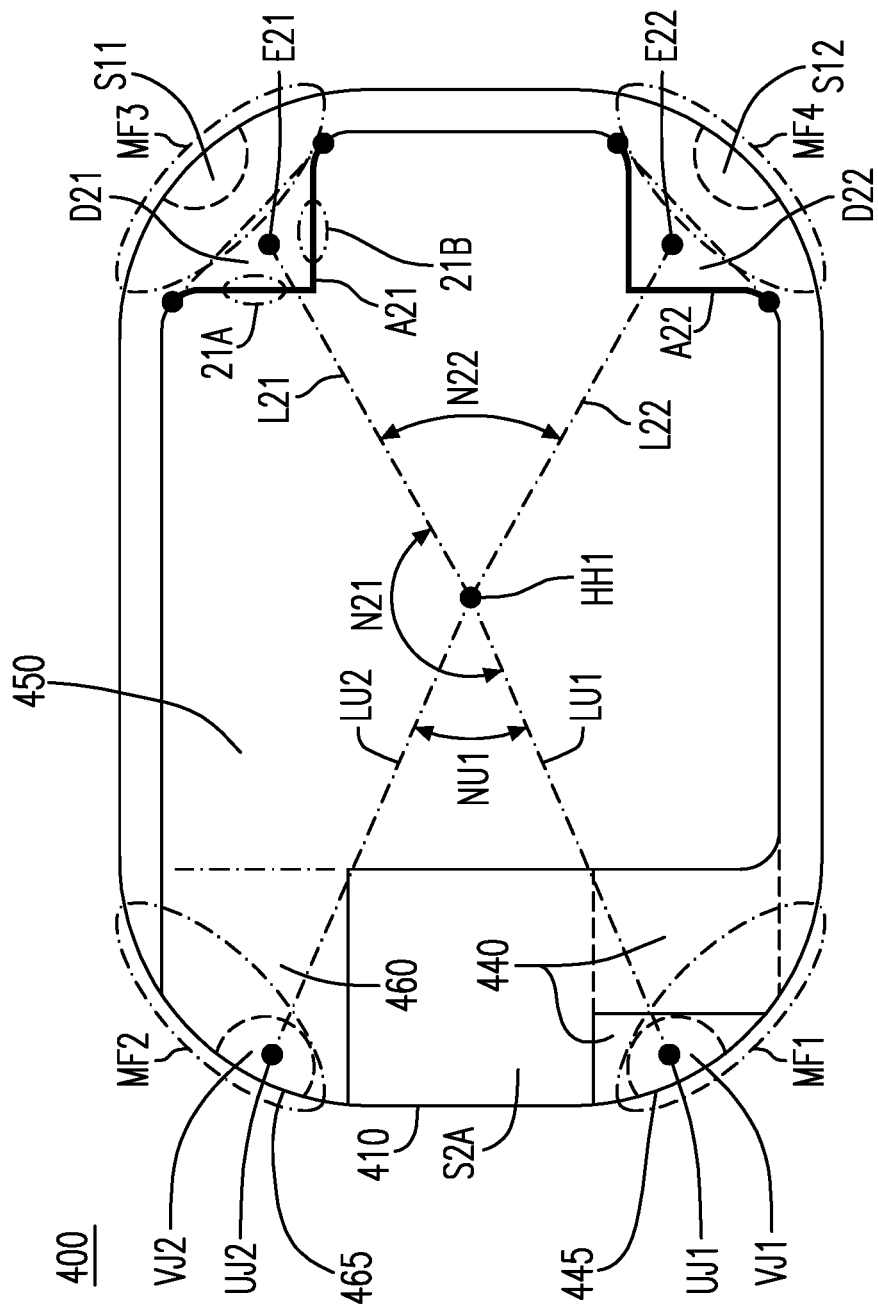
FIG. 3C is a schematic diagram showing a top view of an integrated chip included in the implementation structure shown in FIG. 3A.

Please refer to FIG. 3A, FIG. 3B and FIG. 3C. FIG. 3A is a schematic diagram showing a top view of an implementation structure 28B of the crystal device 280 shown in FIG. 1A. FIG. 3B is a schematic diagram showing a rear view of the implementation structure 28B shown in FIG. 3A. FIG. 3C is a schematic diagram showing a top view of an integrated chip 400 included in the implementation structure 28B shown in FIG. 3A. Please additionally refer to FIGS. 1A, 1B, 1C, 2A, 2B and 2C. As shown in FIGS. 3A, 3B and 3C, the crystal device 280 includes the bearing structure 295 and the integrated chip 400.

In some embodiments, the crystal device 280 is or includes a quartz crystal resonator. The crystal chip 410 is or includes a quartz chip, and further includes a second main surface S2A being opposite to the first main surface S1A. The integrated chip 400 further includes a second excitation electrode 450 and a second extension electrode 460 extending from the second excitation electrode 450. The second excitation electrode 450 is disposed on the second main surface S2A, and includes a second electrode indentation boundary A21 matching the first electrode indentation boundary A11. The second extension electrode 460 includes a second signal transmission terminal 465 being in contact with the bearing structure 295. The second signal transmission terminal 465 has a second support regional center UJ2. The centroid HH1 and the second support regional center UJ2 define a fourth reference line segment LU2 therebetween. A second included angle NU1 formed between the second and the fourth reference line segments LU1 and LU2 ranges from 30 degrees to 90 degrees. For example, preferably, the second included angle NU1 ranges from 50 degrees to 70 degrees.

The bearing structure 295 includes a bearing base 300, a bonding adhesive W1A, a first conductive adhesive W7A and a second conductive adhesive W8A. The bearing base 300 includes a first conductive seat 320, a second conductive seat 340 being separate from the first conductive seat 320, and a support platform 360. The bonding adhesive W1A is at least partly disposed between the support platform 360 and the first support surface portion S11. The first conductive adhesive W7A is at least partly disposed between the first conductive seat 320 and the first signal transmission terminal 445. The second conductive adhesive W8A is at least partly disposed between the second conductive seat 340 and the second signal transmission terminal 465.

In some embodiments, the bearing structure 295 further includes a bonding adhesive W2A. The bearing base 300 further includes a support platform 362. The bonding adhesive W2A is at least partly disposed between the support platform 362 and the second support surface portion S12. The second excitation electrode 450 further includes an electrode indentation boundary A22 matching the second electrode indentation boundary A12. For example, the second signal transmission terminal 465 includes a support region VJ2. The support region VJ2 has the second support regional center UJ2. For example, the second electrode indentation boundary A21 includes a first straight line segment 21A and a second straight line segment 21B being adjacent to the first straight line segment 21A.

The second excitation electrode 450 matches the first excitation electrode 430, and has an electrode area 45Q. The electrode area 45Q is substantially equal to the electrode area 43Q. The second electrode indentation boundary A21 corresponds to the first electrode indentation boundary A11, and has a boundary end B21 and a boundary end B22 being opposite to the boundary end B21. The second electrode indentation boundary A21 and a reference line segment C21 defined by the boundary ends B21 and B22 form an electrode indentation region D21 having an indentation area Q21. The indentation area Q21 is substantially equal to the indentation area Q11. A ratio of the indentation area Q21 to the electrode area 45Q ranges from 0.05 to 0.2. The electrode indentation region D21 further has an indentation regional center E21.

In some embodiments, the electrode indentation boundary A22 corresponds to the second electrode indentation boundary A12, and has a boundary end B23 and a boundary end B24 being opposite to the boundary end B23. The electrode indentation boundary A22 and a reference line segment C22 defined by the boundary ends B23 and B24 form an electrode indentation region D22 having an indentation regional center E22. The electrode indentation region D22 further has an indentation area Q22. A ratio of the indentation area Q22 to the electrode area 45Q ranges from 0.05 to 0.2. For example, the indentation area Q22 is substantially equal to the indentation area Q12, and is substantially equal to the indentation area Q21.

The centroid HH1 and the indentation regional center E21 define a reference line segment L21 therebetween. The centroid HH1 and the indentation regional center E22 define a reference line segment L22 therebetween. An included angle N22 formed between the reference line segments L21 and L22 ranges from 30 degrees to 90 degrees. For example, the reference line segments C21 and C22 are respectively two reference straight line segments. The included angle N22 is substantially equal to the included angle N12. An included angle N21 formed between the second reference line segment LU1 and the reference line segment L21 ranges from 100 degrees to 220 degrees. For example, preferably, the included angle N22 ranges from 50 degrees to 70 degrees. Preferably, the included angle N21 ranges from 140 degrees to 180 degrees.

The first main surface S1A has four surface corner portions MF1, MF2, MF3 and MF4. The four surface corner portions MF1, MF2, MF3 and MF4 are located at four different spatial positions, respectively. The four surface corner portions MF1, MF2, MF3 and MF4 have the support region VJ1, the support region VJ2, the first support surface portion S11 and the second support surface portion S12, respectively.

Figure 4:
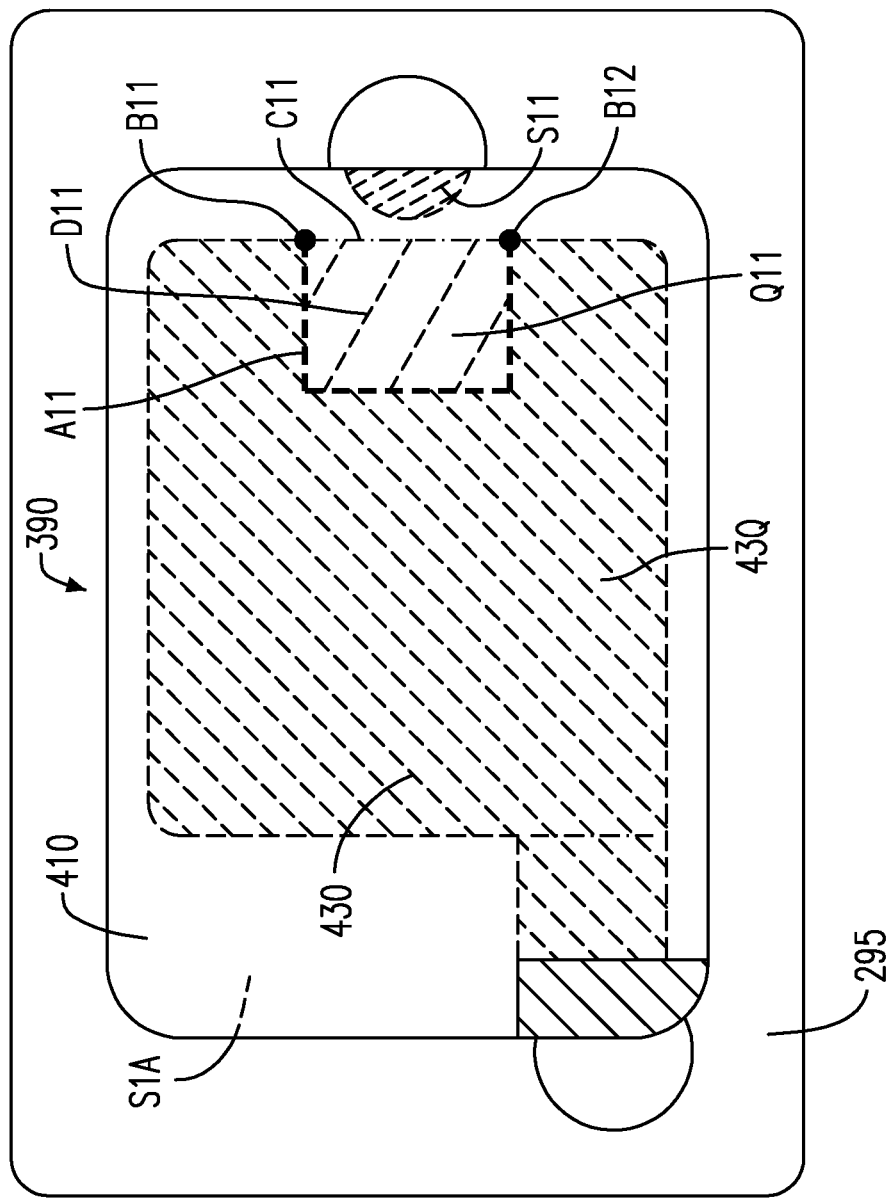
FIG. 4 is a schematic diagram showing a top view of a crystal system according to various embodiments of the present disclosure.

Please refer to FIG. 4, which is a schematic diagram showing a top view of a crystal system 270 according to various embodiments of the present disclosure. As shown in FIG. 4, the crystal system 270 includes a bearing structure 295 and a resonance element 390 supported by the bearing structure 295. The resonance element 390 includes a crystal chip 410 and a first excitation electrode 430. The crystal chip 410 includes a first main surface S1A having a first support surface portion S11. For example, the first support surface portion S11 is in contact with the bearing structure 295.

The first excitation electrode 430 is disposed on the first main surface S1A, has an electrode area 43Q, and includes a first electrode indentation boundary A11 partly encompassing the first support surface portion S11. For example, the first electrode indentation boundary A11 has a first boundary end B11 and a second boundary end B12 being opposite to the first boundary end B11. The first electrode indentation boundary A11 and a first reference line segment C11 defined by the first boundary end B11 and the second boundary end B12 form a first electrode indentation region D11 having an indentation area Q11. A ratio of the indentation area Q11 to the electrode area 43Q ranges between 0.05 and 0.2. For example, the resonance element 390 is the integrated chip 400. The crystal system 270 is the crystal device 280.

Figure 5:
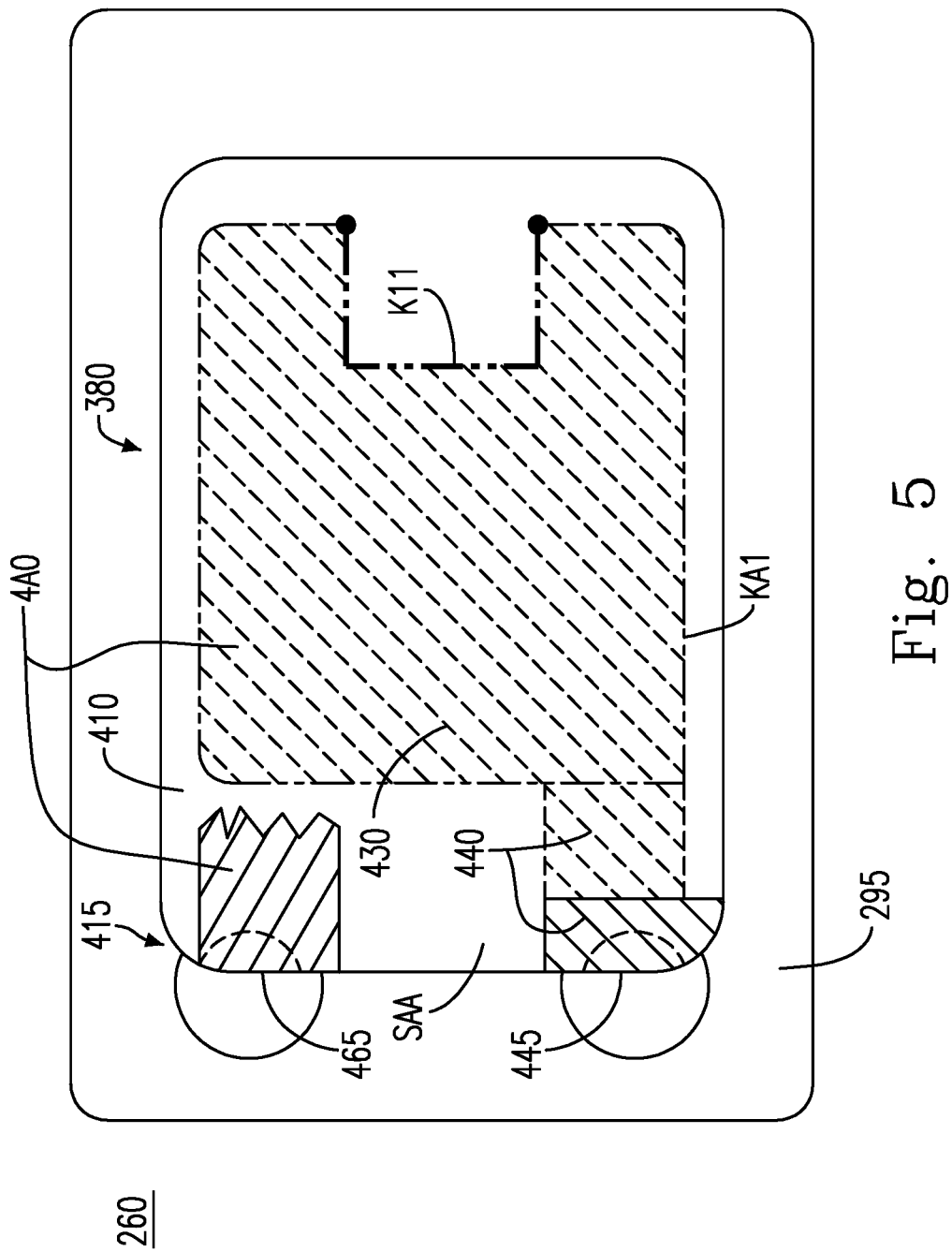
FIG. 5 is a schematic diagram showing a top view of a crystal system according to various embodiments of the present disclosure.

Please refer to FIG. 5, which is a schematic diagram showing a top view of a crystal system 260 according to various embodiments of the present disclosure. As shown in FIG. 5, the crystal system 260 includes a bearing structure 295 and an element 380 supported by the bearing structure 295. The element 380 includes a crystal chip 410 and an electrode structure 4A0.

The crystal chip 410 has a surface structure SAA. The electrode structure 4A0 is disposed on the surface structure SAA, and includes an excitation electrode 430, an extension electrode 440 having a first signal transmission terminal 445, and a second signal transmission terminal 465 matching the first signal transmission terminal 445. For example, the first and the second signal transmission terminals 445 and 465 are disposed on one side 415 of the crystal chip 410. The extension electrode 440 extends from the excitation electrode 430. The bearing structure 295 supports the crystal chip 410 through the first and the second signal transmission terminals 445 and 465. The excitation electrode 430 has a closed boundary KA1. The closed boundary KA1 includes a concave boundary segment K11.

Figure 6A:
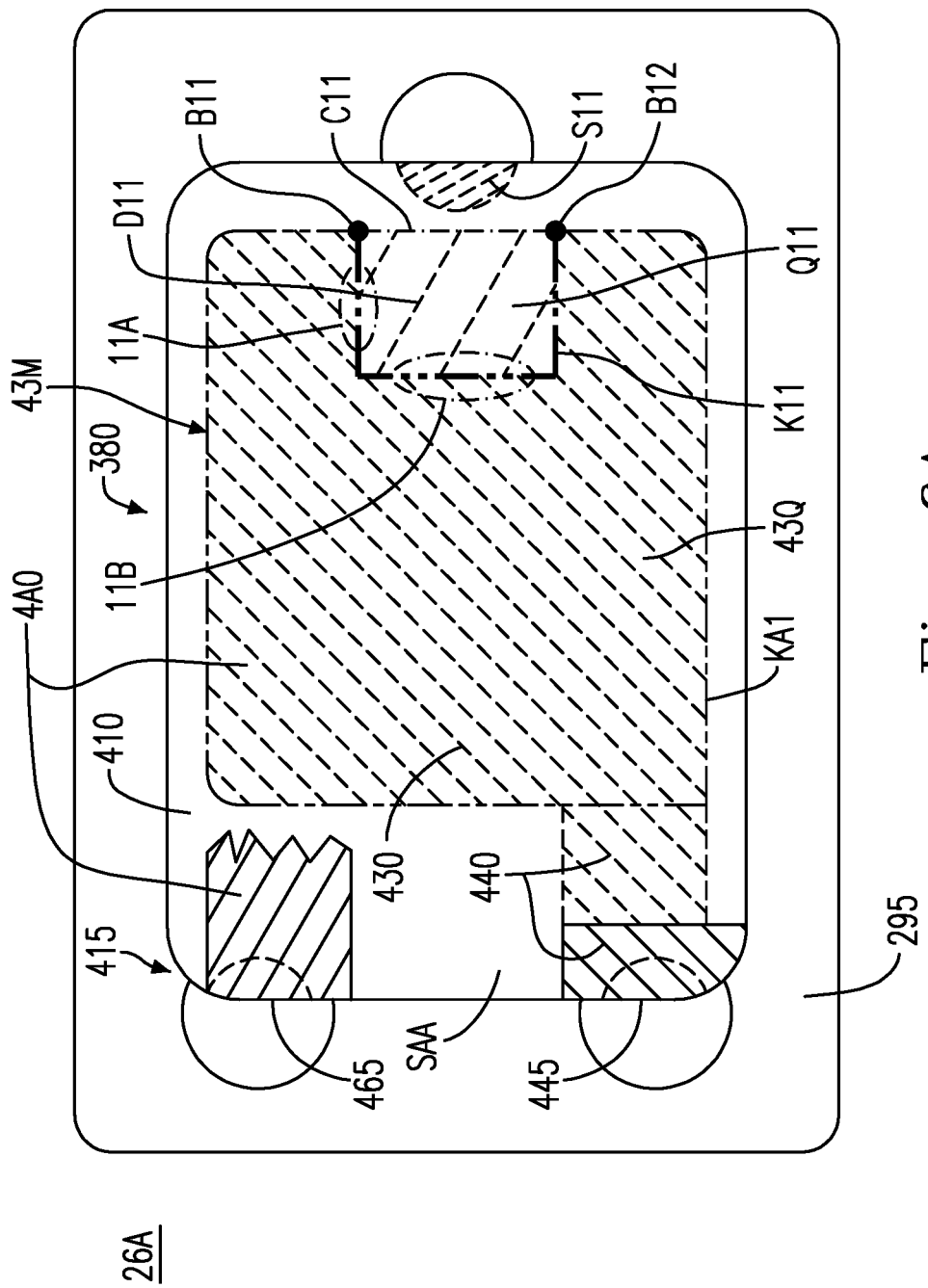
FIG. 6A is a schematic diagram showing a top view of an implementation structure of the crystal device shown in FIG. 5.
Figure 6B:
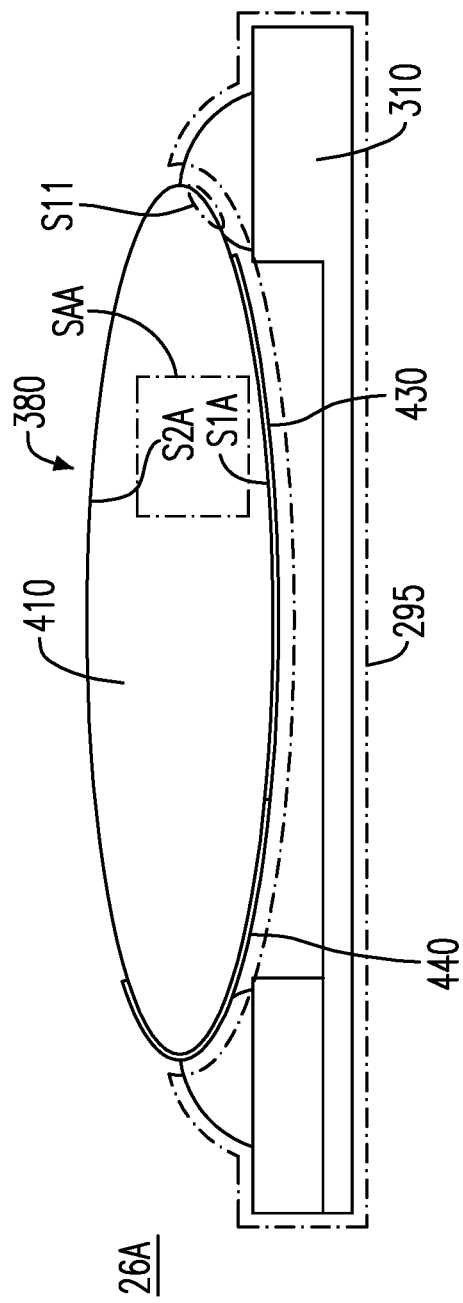
FIG. 6B is a schematic diagram showing a front view of the implementation structure shown in FIG. 6A.
Figure 6C:
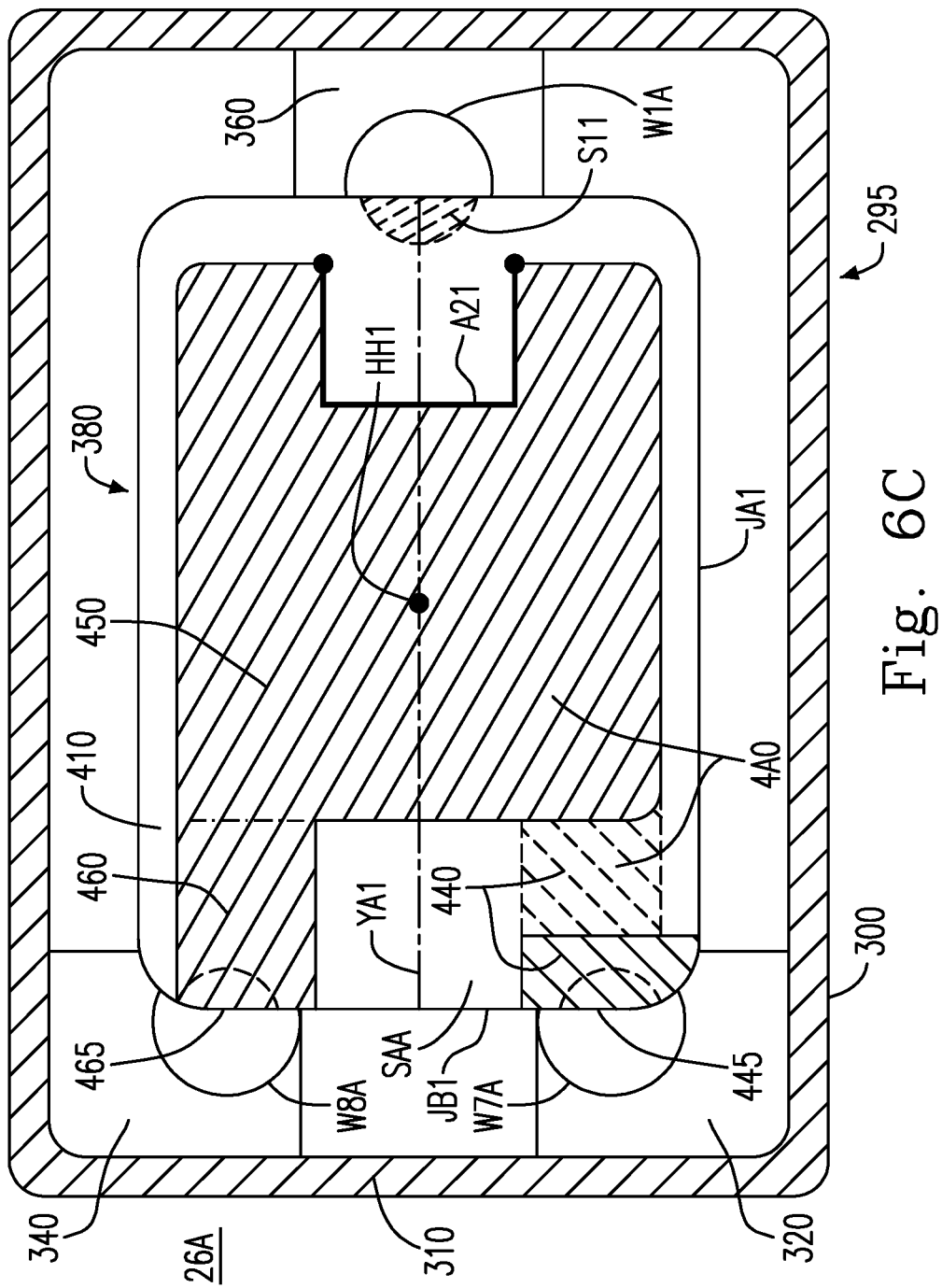
FIG. 6C is a schematic diagram showing a top view of the implementation structure shown in FIG. 6A.
Figure 6D:
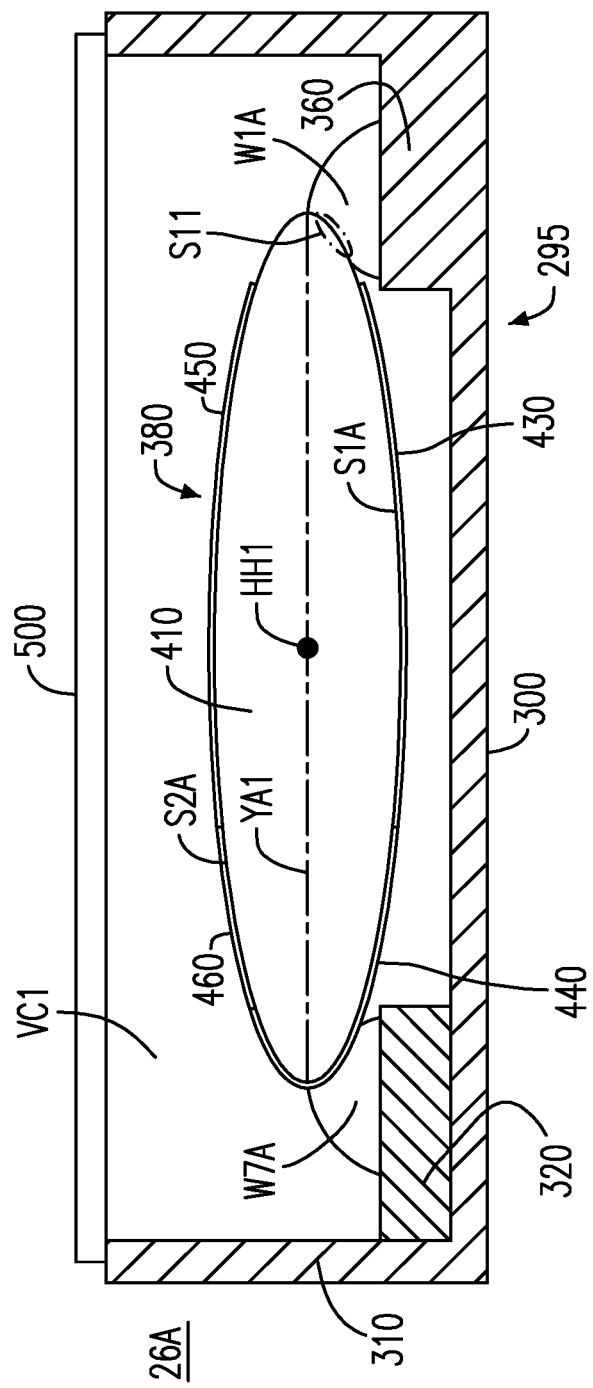
FIG. 6D is a schematic diagram showing a front view of the implementation structure shown in FIG. 6A.

Please refer to FIG. 6A, FIG. 6B, FIG. 6C and FIG. 6D. FIG. 6A is a schematic diagram showing a top view of an implementation structure 26A of the crystal device 260 shown in FIG. 5. FIG. 6B is a schematic diagram showing a front view of the implementation structure 26A shown in FIG. 6A. FIG. 6C is a schematic diagram showing a top view of the implementation structure 26A shown in FIG. 6A. FIG. 6D is a schematic diagram showing a front view of the implementation structure 26A shown in FIG. 6A. Please additionally refer to FIG. 5. As shown in FIGS. 6A, 6B, 6C and 6D, the crystal system 260 includes the bearing structure 295 and the element 380. For example, the element 380 is one of the resonance element 390 and the integrated chip 400. The crystal system 260 is the crystal device 280.

In some embodiments, the concave boundary segment K11 includes a first straight line segment 11A and a second straight line segment 11B being adjacent to the first straight line segment 11A. For example, the second straight line segment 11B is substantially perpendicular to the first straight line segment 11A. The surface structure SAA includes a first main surface S1A and a second main surface S2A being opposite to the first main surface S1A. For example, the excitation electrode 430 is disposed on the first main surface S1A. Each of the first and the second signal transmission terminals 445 and 465 is at least partly disposed on the first main surface S1A. The first main surface S1A has a support surface portion S11. For example, the support surface portion S11 is in contact with the bearing structure 295. The concave boundary segment K11 is the first electrode indentation boundary A11.

The excitation electrode 430 has an electrode area 43Q. The concave boundary segment K11 partly encompasses the support surface portion S11, and has a first boundary end B11 and a second boundary end B12 being opposite to the first boundary end B11. The concave boundary segment K11 and a reference line segment C11 defined by the first and the second boundary ends B11 and B12 form an electrode indentation region D11 having an indentation area Q11. A ratio of the indentation area Q11 to the electrode area 43Q ranges from 0.05 to 0.2.

For example, the electrode structure 4A0 includes the excitation electrode 430, the extension electrode 440, a second excitation electrode 450 and a second extension electrode 460 extending from the second excitation electrode 450. The second excitation electrode 450 is disposed on the second main surface S2A. The second extension electrode 460 has the second signal transmission terminal 465. The excitation electrode 430 has a geometrical shape 43M. The geometrical shape 43M is formed by the closed boundary KA1. The closed boundary KA1 is an outer closed boundary. For example, the concave boundary segment K11 includes a curve segment.

In some embodiments, the crystal chip 410 further has a major axis YA1, a relatively long edge JA1 and a relatively short edge JB1. For example, the major axis YA1 passes through the centroid HH1, and is substantially parallel with the relatively long edge JA1. The relatively long edge JA1 is substantially perpendicular to the relatively short edge JB1. The extension electrode 440 extends from the excitation electrode 430 to the relatively short edge JB1. The second extension electrode 460 extends from the second excitation electrode 450 to the relatively short edge JB1. The first and the second main surfaces S1A and S2A have a first central portion and a second central portion, respectively. The excitation electrode 430 and the second excitation electrode 450 are respectively disposed on the first and the second central portions.

The geometrical shape 43M forms at least one indentation to avoid influencing the best excitation mode. The second excitation electrode 450 matches the excitation electrode 430. The geometrical shape 43M of the excitation electrode 430 is presented with one of a convex shape and a concave shape, and is different from one of a rectangular shape and a circular shape shown in the prior art. The geometrical shape 43M includes an irregular shape being one of a convex shape and a concave shape. The excitation electrode 430 may be formed by combining irregular shape electrodes which have shapes selected from a group consisting of a rectangular shape, a circular shape, a concave shape and a convex shape. The excitation electrode 430 has an electrode material; and the electrode material is a conductive material. Any of the first electrode indentation boundary A11, the second electrode indentation boundary A12 and the second electrode indentation boundary A21 is used for a damping compensation of the resonance element 390.

An excitation electrode disclosed in the prior art has a specific shape. For example, the specific shape is one selected from a group consisting of a square shape, a rectangular shape and a circular shape. The geometrical shape 43M of the excitation electrode 430 shown in the present disclosure is different from the specific shape. The excitation electrode 430 having the geometrical shape 43M causes the resonance element 390 to form a different oscillation strength. The excitation electrode 430 can be used to manufacture the crystal device 280 being or including a quartz-crystal resonator, so that the crystal device 280 can be used for a vehicle. The resonance element 390 including the excitation electrode 430 can be applied to a different adhesive-dispensing mode to increase a design space of the crystal device 280, can meet a characteristic requirement having the high strength anti-drop, and keeps the original product property under a condition of meeting the characteristic requirement.

For example, the crystal device 280 further includes a lid 500. The bonding adhesive W1A is a conductive adhesive. Each of the bonding adhesive W1A, the first conductive adhesive W7A and the second conductive adhesive W8A is a silver adhesive; and the bonding adhesive W1A, the first conductive adhesive W7A and the second conductive adhesive W8A have the same material. Each of the first excitation electrode 430, the first extension electrode 440, the second excitation electrode 450 and the second extension electrode 460 is a metal electrode. For example, the metal electrode is a silver electrode. The first excitation electrode 430, the first extension electrode 440, the second excitation electrode 450 and the second extension electrode 460 are associated with frequency adjustment, frequency stability, and electrical property of the product. For example, the lid 500 is an upper lid.

The bearing base 300 has a containment space VC1, and includes an insulation seat body 310, the first conductive seat 320, and the second conductive seat 340 being separate from the first conductive seat 320. Each of the first and the second conductive seats 320 and 340 is disposed in the insulation seat body 310. The insulation seat body 310 includes the support platform 360, is a ceramic seat body, and is used to fix the first and the second conductive seats 320 and 340 to cause the bearing base 300 to have a signal contact point for the electrical signal. The lid 500 is disposed on the bearing base 300, and is used to insulate the containment space VC1 from the external environment and to seal the bearing base 300. The resonance element 390 is used to form an electrical signal. The first and the second conductive adhesives W7A and W8A are used to transmit the electrical signal.

The first and the second conductive adhesives W7A and W8A are respectively disposed on the first and the second conductive seats 320 and 340. The crystal chip 410 is or includes a quartz chip, and is used to form a frequency signal source. Each of the first and the second conductive adhesives W7A and W8A is disposed between the integrated chip 400 and the bearing base 300, serves as a signal transmission medium, and serves as a fixing support point. The first and the second excitation electrodes 430 and 450 are used to excite the crystal chip 410 to oscillate to generate the electrical signal having a frequency. The first extension electrode 440 is used to electrically connect the first excitation electrode 430 and the first conductive adhesive W7A. The second extension electrode 460 is used to electrically connect the second excitation electrode 450 and the second conductive adhesive W8A.

Figure 7C:
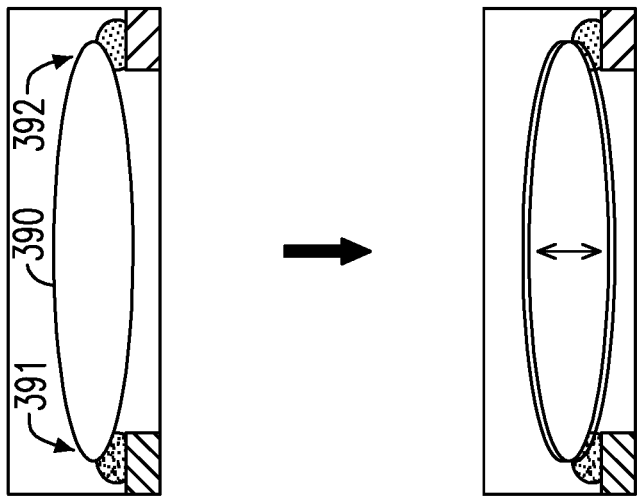
FIG. 7C is a schematic diagram showing a third support of a resonance element according to various embodiments of the present disclosure.
Figure 7B:
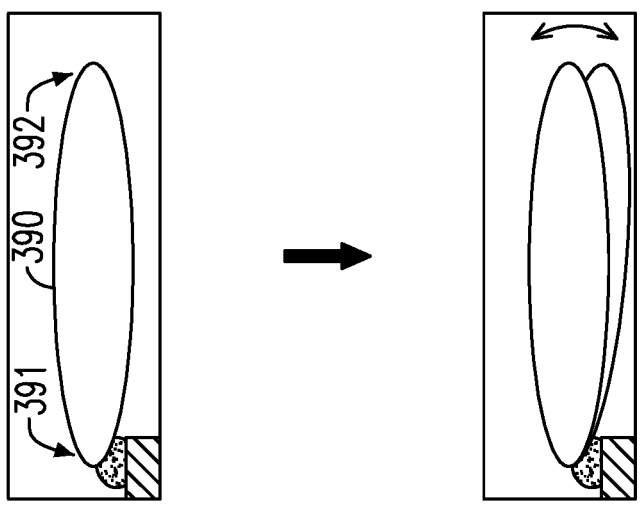
FIG. 7B is a schematic diagram showing a second support of a resonance element according to various embodiments of the present disclosure.
Figure 7A:
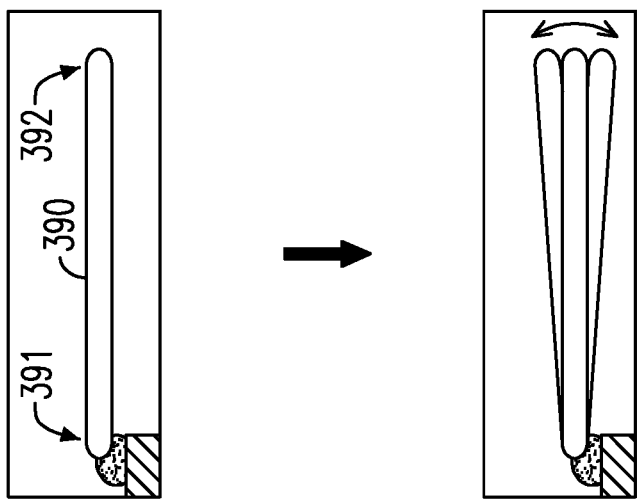
FIG. 7A is a schematic diagram showing a first support of a resonance element according to various embodiments of the present disclosure.

Please refer to FIG. 7A, FIG. 7B and FIG. 7C. FIG. 7A is a schematic diagram showing a first support of a resonance element 390 according to various embodiments of the present disclosure. FIG. 7B is a schematic diagram showing a second support of a resonance element 390 according to various embodiments of the present disclosure. FIG. 7C is a schematic diagram showing a third support of a resonance element 390 according to various embodiments of the present disclosure. The resonance element 390 has a first side 391 and a second side 392 being opposite to the first side 391. As shown in FIG. 7A, the first side 391 of the resonance element 390 is fixed to the bearing structure 295. The resonance element 390 shown in FIG. 7A has a relatively high resonance frequency, is in a first static state at a first time, and is in a first vibration state at a second time being different from the first time. For example, the relatively high resonance frequency is a normal frequency that is generally used.

As shown in FIG. 7B, the first side 391 of the resonance element 390 is fixed to the bearing structure 295. The resonance element 390 shown in FIG. 7B has a relatively low resonance frequency, is in a second static state at a third time, and is in a second vibration state at a fourth time being different from the third time. As shown in FIG. 7C, each of the first and the second sides 391 and 392 of the resonance element 390 is fixed to the bearing structure 295. The resonance element 390 shown in FIG. 7C has a relatively low resonance frequency, is in a third static state at a fifth time, and is in a third vibration state at a sixth time being different from the fifth time. For example, the relatively low resonance frequency is equal to 8 M Hz.

The thickness of the crystal chip 410 is increased with the reduction of the resonance frequency. Under a condition that the thickness of the crystal chip 410 is increased, the angle of the resonance element 390 being available to be offset is reduced when the resonance element 390 is disposed onto the bearing structure 295. Under a condition that the thickness of the crystal chip 410 is increased, the weight of the crystal chip 410 rises so as to easily cause the resonance element 390 to deform downward, thereby causing the crystal chip 410 to touch the insulation seat body 310. Under a condition that the crystal chip 410 touches the insulation seat body 310, the oscillation of the crystal chip 410 can cause the electricity to be unstable, so that the use of a specific adhesive-dispensing method can limit the space which the chip deforms downward. However, the specific adhesive-dispensing method can also cause the electrical property to change, so that the use of a specific electrode may adjust the changed electrical property caused due to the change of the adhesive-dispensing method.

In some embodiments, because the thickness of the crystal chip 410 is increased, the bonding adhesive W1A is at least partly disposed between the support platform 360 and the first support surface portion S11 of the crystal chip 410 to prevent the crystal chip 410 from downward deformation, thereby increasing the oscillation stability of the crystal chip 410. Under a condition that the bonding adhesive W1A is at least partly disposed between the support platform 360 and the first support surface portion S11 and the first excitation electrode 430 is too close to the first support surface portion S11, the oscillation formed by the resonance element 390 can have a phenomenon of frequency instability. For example, the first support surface portion S11 is included in the second side 392 of the resonance element 390.

In order to solve the phenomenon of frequency instability, the geometrical shape of the original excitation electrode is changed to the geometrical shape 43M, so that the original excitation electrode is changed to the first excitation electrode 430. Therefore, the first excitation electrode 430 includes the first electrode indentation boundary A11, partly encompassing the first support surface portion S11, to increase the oscillation stability of the crystal chip 410. The first excitation electrode 430 has he electrode area 43Q. The first electrode indentation boundary A11 and the first reference line segment C11 form the first electrode indentation region D11 having the indentation area Q11. A ratio of the indentation area Q11 to the electrode area 43Q ranges from 0.05 to 0.2. Therefore, the original oscillation property of the resonance element 390 can be kept. The geometrical shape and the size of the first excitation electrode 430 can affect the oscillation property of the resonance element 390.

Figure 8A:
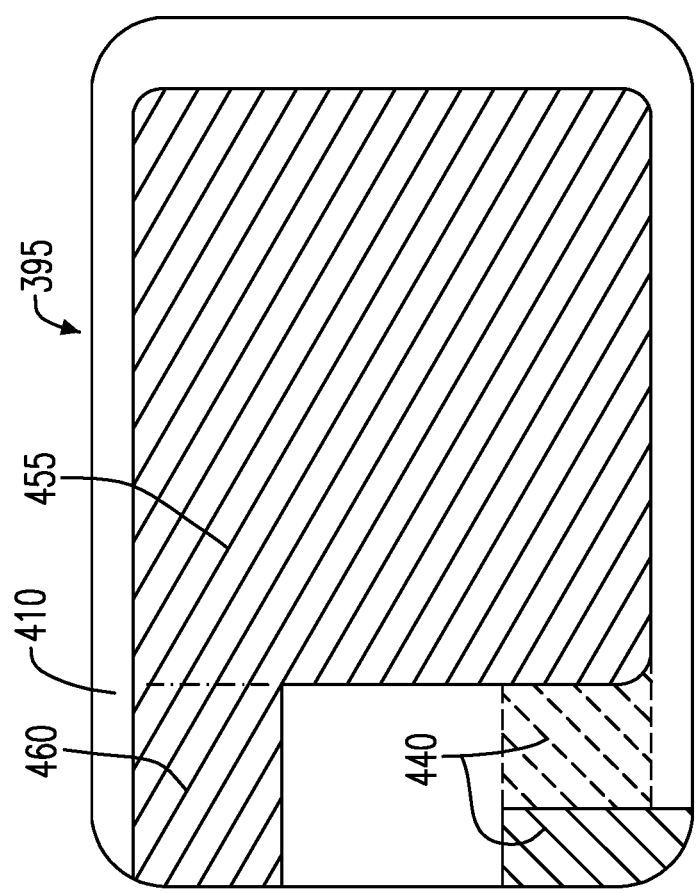
FIG. 8A is a first schematic structure diagram showing a first resonance element according to various embodiments of the present disclosure.
Figure 8B:
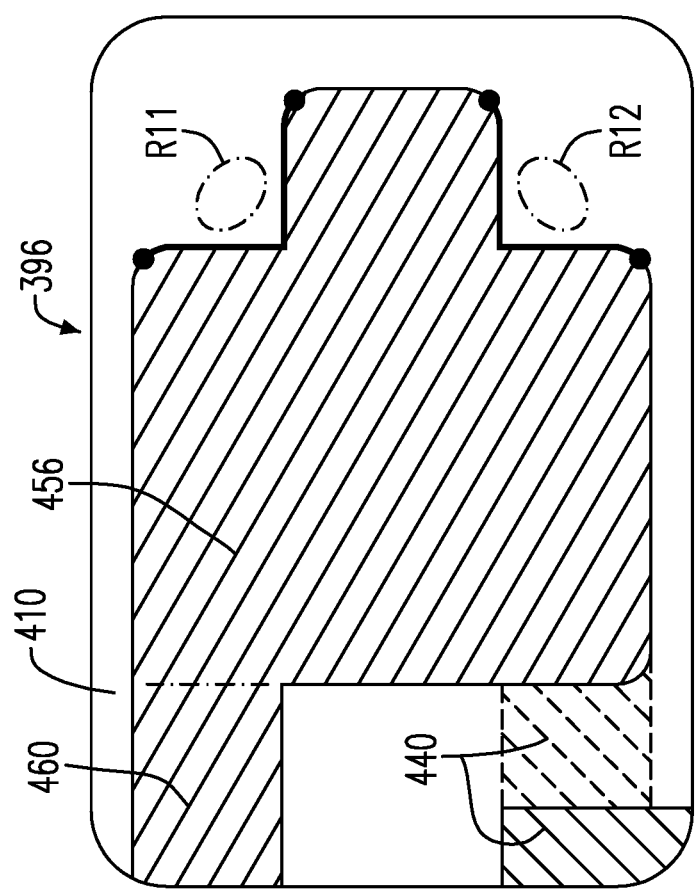
FIG. 8B is a second schematic structure diagram showing a second resonance element according to various embodiments of the present disclosure.
Figure 8C:
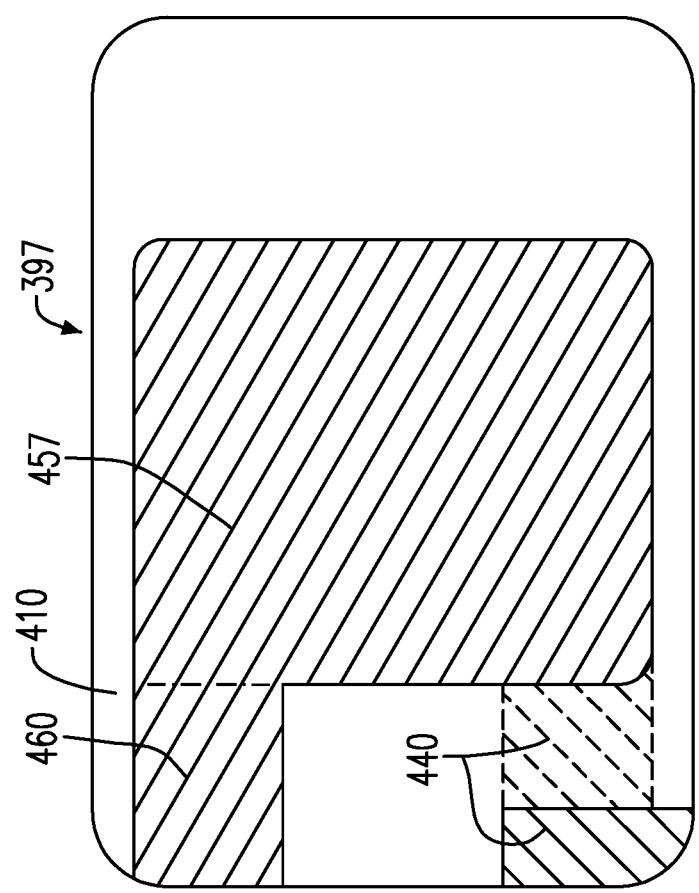
FIG. 8C is a third schematic structure diagram showing a third resonance element according to various embodiments of the present disclosure.
Figure 8D:
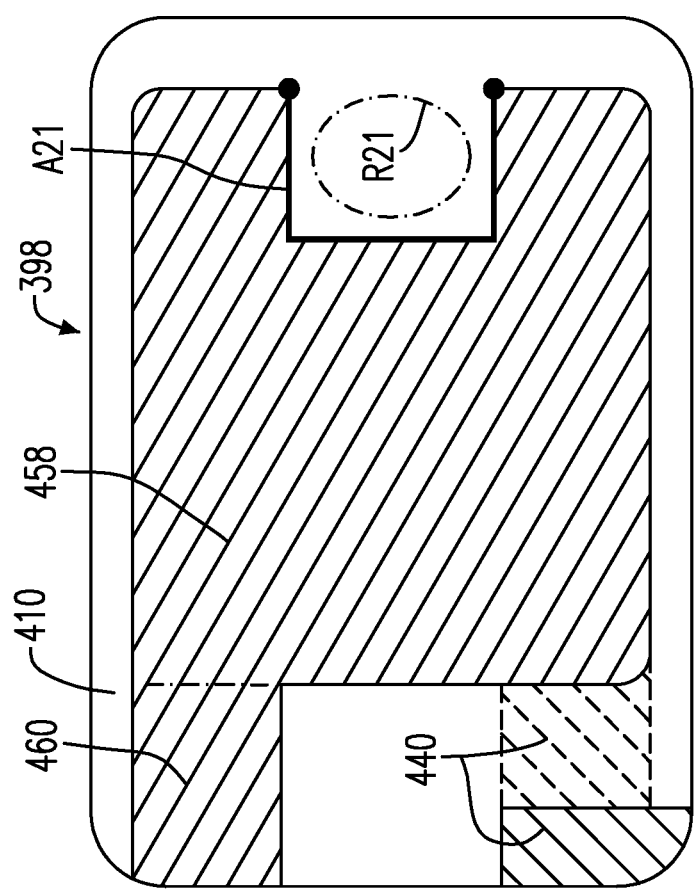
FIG. 8D is a fourth schematic structure diagram showing a fourth resonance element according to various embodiments of the present disclosure.

Please refer to FIG. 8A, FIG. 8B, FIG. 8C and FIG. 8D. FIG. 8A is a first schematic structure diagram showing a first resonance element 395 according to various embodiments of the present disclosure. FIG. 8B is a second schematic structure diagram showing a second resonance element 396 according to various embodiments of the present disclosure. FIG. 8C is a third schematic structure diagram showing a third resonance element 397 according to various embodiments of the present disclosure. FIG. 8D is a fourth schematic structure diagram showing a fourth resonance element 398 according to various embodiments of the present disclosure. The first, the second, the third and the fourth resonance elements 395, 396, 397 and 398 respectively include an excitation electrode 455, an excitation electrode 456, an excitation electrode 457 and an excitation electrode 458.

The excitation electrode 455 has a relatively large electrode area. The excitation electrode 456 has two corner indentations R11 and R12, and a first specific electrode area. The excitation electrode 457 has a relatively small electrode area. The excitation electrode 457 has a side indentation R21 and a second specific electrode area. Each of the first and the second specific electrode areas is greater than the relatively small electrode area, and is less than the relatively large electrode area.

Simulations performed to the first, the second, the third and the fourth resonance elements 395, 396, 397 and 398 can obtain a plurality of simulation results. The first, the second, the third and the fourth resonance elements 395, 396, 397 and 398 respectively have different geometrical shapes, and thereby respectively form a first oscillation range, a second oscillation range, a third oscillation range and a fourth oscillation range. The first, the second, the third and the fourth oscillation ranges are different. The larger an excitation electrode is, the wider the formed oscillation range is. That is, under a condition that the first, the second, the third and the fourth resonance elements 395, 396, 397 and 398 are not supported, each of the second and the third oscillation ranges is less than the first oscillation range, and the third oscillation range is less than the fourth oscillation range.

Although the first specific electrode area of the excitation electrode 456 is less than the relatively large electrode area of the excitation electrode 455, the second oscillation range of the second resonance element 396 can be approximate to the first oscillation range of the first resonance element 395 by using the two corner indentations R11 and R12. Although the second specific electrode area of the excitation electrode 458 is less than the relatively large electrode area of the excitation electrode 455, the fourth oscillation range of the fourth resonance element 398 can be approximate to the first oscillation range of the first resonance element 395 by using the side indentation R21.

Please refer to FIGS. 1A, 2A, 3A, 8A, 8B, 8C and 8D. Under a condition that the first excitation electrode 430 is even more close to the bonding adhesive W1A, the oscillation range of the resonance element 390 can be influenced to shrink inwards. Under a condition that the first excitation electrode 430 is even more away from the bonding adhesive W1A, the oscillation range of the resonance element 390 is even more less influenced. For example, the damping ratio for the first electrode indentation region D11 of the resonance element 390 ranges from 5% to 15%.

Figure 9A:
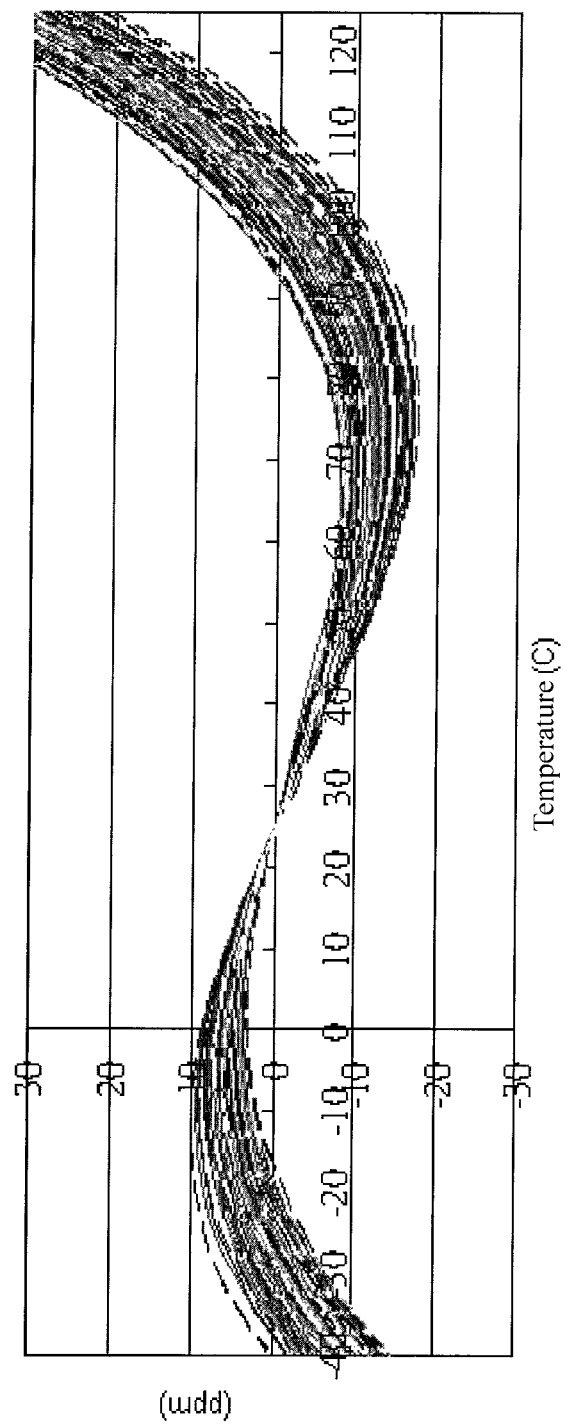
FIG. 9A is a schematic diagram showing a measured frequency changed with a temperature for the second resonance element shown in FIG. 8B.
Figure 9B:
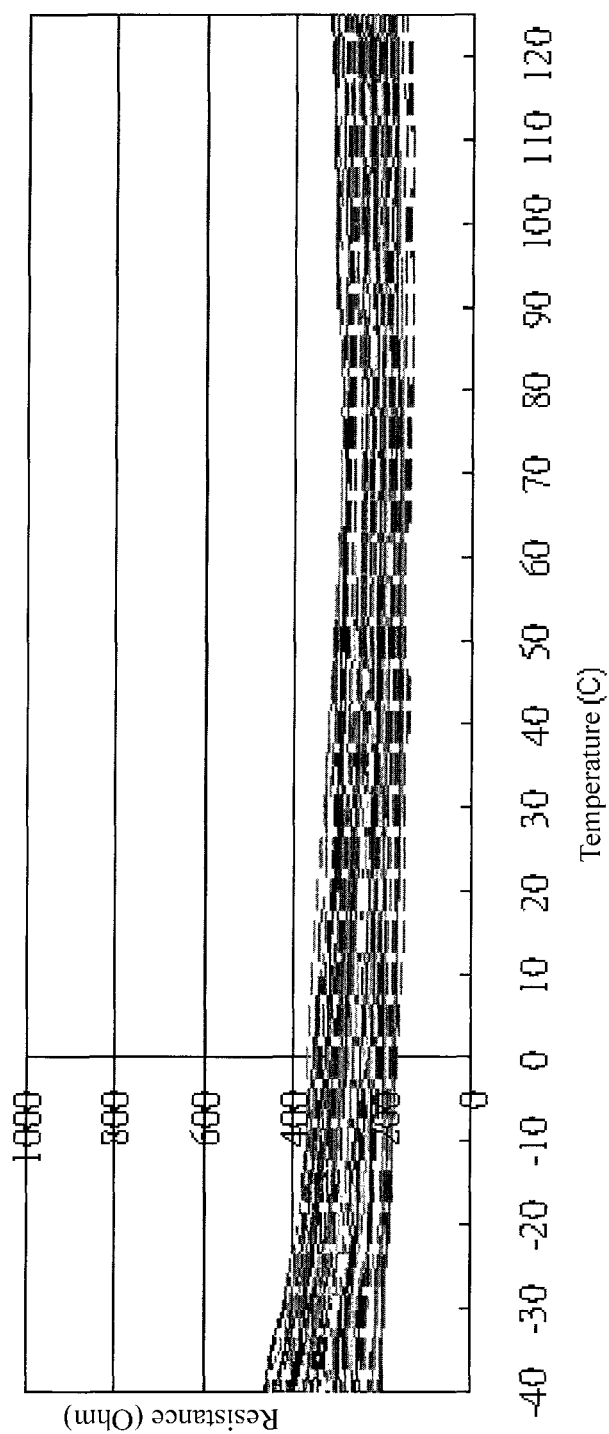
FIG. 9B is a schematic diagram showing a measured impedance changed with a temperature for the second resonance element shown in FIG. 8B.

Please refer to FIG. 9A and FIG. 9B. FIG. 9A is a schematic diagram showing a measured frequency changed with a temperature for the second resonance element 396 shown in FIG. 8B. FIG. 9B is a schematic diagram showing a measured impedance changed with a temperature for the second resonance element 396 shown in FIG. 8B. As shown in FIGS. 9A and 9B, the excitation electrode 456 can cause the resistance of the second resonance element 396 to change at different temperatures, and can cause the resistance of the second resonance element 396 to increase at a relatively low temperature.

While the invention has been described in terms of what is presently considered to be the most practical and preferred embodiments, it is to be understood that the disclosure need not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A crystal device comprising a bearing structure and an integrated chip supported by the bearing structure, wherein the integrated chip comprises:
   a crystal chip including a first main surface having a first support surface portion being in contact with the bearing structure; and
   a first excitation electrode disposed on the first main surface, having an electrode area, and including a first electrode indentation boundary partly encompassing the first support surface portion, wherein:
      the first electrode indentation boundary has a first boundary end and a second boundary end being opposite to the first boundary end;
      the first electrode indentation boundary and a first reference line segment defined by the first and the second boundary ends form a first electrode indentation region having an indentation area; and
      a ratio of the indentation area to the electrode area ranges from 0.05 to 0.2.

2. The crystal device according to claim 1, wherein:
   the first electrode indentation region is adjacent to the first support surface portion, and further has a first indentation regional center;
   the first main surface further has a second support surface portion being separate from the first support surface portion and in contact with the bearing structure; and
   the first excitation electrode further includes a second electrode indentation boundary partly encompassing the second support surface portion, wherein the second electrode indentation boundary has a third boundary end and a fourth boundary end being opposite to the third boundary end, and the second electrode indentation boundary and a second reference line segment defined by the third and the fourth boundary ends form a second electrode indentation region having a second indentation regional center.

3. The crystal device according to claim 2, wherein:
   the crystal chip has a centroid;
   the centroid and the first indentation regional center define a third reference line segment therebetween;

the centroid and the second indentation region center define a fourth reference line segment therebetween; and an included angle formed between the third and the fourth reference line segments ranges from 30 to 90 degrees.

4. The crystal device according to claim 1, wherein:

the crystal chip has a centroid;

the first electrode indentation region has a first indentation regional center;

the integrated chip further comprises a first extension electrode; and the first extension electrode extends from the first excitation electrode, and includes a first signal transmission terminal being in contact with the bearing structure.

5. The crystal device according to claim 4, wherein:

the first signal transmission terminal has a first support regional center;

the centroid and the first support regional center define a second reference line segment therebetween;

the centroid and the first indentation regional center define a third reference line segment therebetween; and a first included angle formed between the second and the third reference line segments ranges from 100 to 220 degrees.

6. The crystal device according to claim 5, wherein:

the crystal device includes a quartz crystal resonator;

the crystal chip includes a quartz chip, and further includes a second main surface being opposite to the first main surface;

the integrated chip further comprises a second excitation electrode and a second extension electrode extending from the second excitation electrode; and the second excitation electrode is disposed on the second main surface, and includes a second electrode indentation boundary matching the first electrode indentation boundary.

7. The crystal device according to claim 6, wherein:

the second extension electrode includes a second signal transmission terminal being in contact with the bearing structure;

the second signal transmission terminal has a second support regional center;

the centroid and the second support region center define a fourth reference line segment therebetween; and a second included angle formed between the second and the fourth reference line segments ranges from 30 to 90 degrees.

8. The crystal device according to claim 7, wherein:

the bearing structure includes a bearing base, a bonding adhesive, a first conductive adhesive and a second conductive adhesive;

the bearing base includes a first conductive seat, a second conductive seat being separate from the first conductive seat, and a support platform;

the bonding adhesive is at least partly disposed between the support platform and the first support surface portion;

the first conductive adhesive is at least partly disposed between the first conductive seat and the first signal transmission terminal; and the second conductive adhesive is at least partly disposed between the second conductive seat and the second signal transmission terminal.

9. A resonance element supported by a bearing structure, and comprising:

a crystal chip including a first main surface having a first support surface portion being in contact with the bearing structure; and a first excitation electrode disposed on the first main surface, having an electrode area, and including a first electrode indentation boundary partly encompassing the first support surface portion, wherein:

the first electrode indentation boundary has a first boundary end and a second boundary end being opposite to the first boundary end;

the first electrode indentation boundary and a first reference line segment defined by the first and the second boundary ends form a first electrode indentation region having an indentation area; and a ratio of the indentation area to the electrode area ranges from 0.05 to 0.2.

10. The resonance element according to claim 9, wherein:

the first electrode indentation region is adjacent to the first support surface portion, and further has a first indentation regional center;

the first main surface further has a second support surface portion being separate from the first support surface portion, wherein the second support surface portion is in contact with the bearing structure; and the first excitation electrode further includes a second electrode indentation boundary partly encompassing the second support surface portion, wherein the second electrode indentation boundary has a third boundary end and a fourth boundary end being opposite to the third boundary end, and the second electrode indentation boundary and a second reference line segment defined by the third and the fourth boundary ends form a second electrode indentation region having a second indentation regional center.

11. The resonance element according to claim 10, wherein:

the crystal chip has a centroid;

the centroid and the first indentation regional center define a third reference line segment therebetween;

the centroid and the second indentation regional center define a fourth reference line segment therebetween; and an included angle formed between the third and the fourth reference line segments ranges from 30 to 90 degrees.

12. The resonance element according to claim 9, wherein:

the crystal chip has a centroid;

the first electrode indentation region has a first indentation regional center;

the resonance element further comprises a first extension electrode; and the first extension electrode extends from the first excitation electrode, and includes a first signal transmission terminal being in contact with the bearing structure.

13. The resonance element according to claim 12, wherein:

the first signal transmission terminal has a first support regional center;

the centroid and the first support regional center define a second reference line segment therebetween;

the centroid and the first indentation regional center define an third reference line segment therebetween; and a first included angle between the second reference line segment and the third reference line segment ranges from 100 to 220 degrees.

14. The resonance element according to claim 13, wherein:
the crystal chip is a quartz chip, and further includes a second main surface being opposite to the first main surface;
the resonance element further comprises a second excitation electrode and a second extension electrode extending from the second excitation electrode; and
the second excitation electrode is disposed on the second main surface, and includes a second electrode indentation boundary matching the first electrode indentation boundary.

15. The resonance element according to claim 14, wherein:
the second extension electrode includes a second signal transmission terminal being in contact with the bearing structure;
the second signal transmission terminal has a second support regional center;
the centroid and the second support region center define a fourth reference line segment therebetween; and
a second included angle formed between the second and the fourth reference line segments ranges from 30 to 90 degrees.

16. The resonance element according to claim 15, wherein:
the bearing structure includes a bearing base, a bonding adhesive, a first conductive adhesive and a second conductive adhesive;
the bearing base includes a first conductive seat, a second conductive seat being separate from the first conductive seat, and a support platform;
the bonding adhesive is at least partly disposed between the support platform and the first support surface portion;
the first conductive adhesive is at least partly disposed between the first conductive seat and the first signal transmission terminal; and
the second conductive adhesive is at least partly disposed between the second conductive seat and the second signal transmission terminal.

17. An element supported by a bearing structure, and comprising:
a crystal chip having a surface structure; and
an electrode structure disposed on the surface structure, and including an excitation electrode, an extension electrode having a first signal transmission terminal, and a second signal transmission terminal matching the first signal transmission terminal, wherein:
the first and the second signal transmission terminals are disposed on one side of the crystal chip;
the extension electrode extends from the excitation electrode;
the bearing structure supports the crystal chip through the first and the second signal transmission terminals;
the excitation electrode has a closed boundary; and
the closed boundary includes a concave boundary segment,
wherein the concave boundary segment includes a first straight line segment and a second straight line segment being adjacent to the first straight line segment; and the second straight line segment is substantially perpendicular to the first straight line segment.

18. The element according to claim 17, wherein:
the surface structure includes a first main surface and a second main surface being opposite to the first main surface, wherein the excitation electrode is disposed on the first main surface, and each of the first and the second signal transmission terminals is at least partly disposed on the first main surface; and
the first main surface has a support surface portion being in contact with the bearing structure.

19. The element according to claim 18, wherein:
the excitation electrode has an electrode area;
the concave boundary segment partly encompasses the support surface portion, and has a first boundary end and a second boundary end being opposite to the first boundary end;
the concave boundary segment and a reference line segment defined by the first and the second boundary ends form an electrode indentation region having an indentation area; and
a ratio of the indentation area to the electrode area ranges from 0.05 to 0.2.

* * * * *